(12) United States Patent
Fujieda et al.

(10) Patent No.: US 11,699,672 B2
(45) Date of Patent: Jul. 11, 2023

(54) SEMICONDUCTOR DEVICE AND METHOD FOR MANUFACTURING SAME

(71) Applicant: DENSO CORPORATION, Kariya (JP)

(72) Inventors: Mariko Fujieda, Kariya (JP); Kazuaki Mawatari, Kariya (JP); Shinji Kawano, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 17/371,586

(22) Filed: Jul. 9, 2021

(65) Prior Publication Data

US 2021/0335740 A1 Oct. 28, 2021

Related U.S. Application Data

(60) Division of application No. 16/392,881, filed on Apr. 24, 2019, now Pat. No. 11,127,702, which is a continuation of application No. PCT/JP2017/043183, filed on Nov. 30, 2017.

(30) Foreign Application Priority Data

Dec. 20, 2016 (JP) .................................. 2016-246981
Mar. 27, 2017 (JP) .................................. 2017-061559

(51) Int. Cl.
*H01L 23/00* (2006.01)
*G01L 19/06* (2006.01)
*H01L 29/84* (2006.01)
*G01L 9/00* (2006.01)

(52) U.S. Cl.
CPC ................ *H01L 24/08* (2013.01); *G01L 9/00* (2013.01); *G01L 19/06* (2013.01); *H01L 24/03* (2013.01); *H01L 24/32* (2013.01); *H01L 24/48* (2013.01); *H01L 24/73* (2013.01); *H01L 29/84* (2013.01); *H01L 2224/04042* (2013.01); *H01L 2224/48091* (2013.01); *H01L 2224/73215* (2013.01); *H01L 2224/8592* (2013.01)

(58) Field of Classification Search
None
See application file for complete search history.

(56) References Cited

U.S. PATENT DOCUMENTS

| 4,733,289 | A | 3/1988 | Tsurumaru |
| 4,990,993 | A | 2/1991 | Tsurumaru |
| 8,420,446 | B2 * | 4/2013 | Yo ........................... H01L 24/85 438/123 |
| 2001/0028072 | A1 | 10/2001 | Aoki et al. |
| 2007/0007607 | A1 | 1/2007 | Sakai et al. |
| 2009/0218643 | A1 | 9/2009 | Kaminaga et al. |
| 2014/0077824 | A1 | 3/2014 | Niimi et al. |
| 2015/0219513 | A1 | 8/2015 | Uematsu |

FOREIGN PATENT DOCUMENTS

| CN | 202101773 U | 1/2012 |
| JP | 2001-116639 A | 4/2001 |
| JP | 2007-311685 A | 11/2007 |

* cited by examiner

*Primary Examiner* — Alexander G Ghyka
(74) *Attorney, Agent, or Firm* — Posz Law Group, PLC

(57) ABSTRACT

A semiconductor device includes a pad formed on a surface of a substrate, a bonding wire for connecting the pad to an external circuit, and a resin layer covering at least a connection portion between the pad and the bonding wire and exposing at least a part of the substrate outside the pad.

5 Claims, 7 Drawing Sheets

SEMICONDUCTOR DEVICE AND METHOD FOR MANUFACTURING SAME

CROSS REFERENCE TO RELATED APPLICATION

The present application is a continuation application of International Patent Application No. PCT/JP2017/043183 filed on Nov. 30, 2017, which designated the U.S. and claims the benefit of priority from Japanese Patent Application No. 2016-246981 filed on Dec. 20, 2016 and Japanese Patent Application No. 2017-61559 filed on Mar. 27, 2017. The entire disclosures of all of the above applications are incorporated herein by reference.

TECHNICAL FIELD

The present disclosure relates to relates to a semiconductor device and a method of manufacturing the same.

BACKGROUND

For example, a pressure sensor includes a strain gauge formed on a diaphragm and a pad formed on the outside of the diaphragm, and a surface of a region including the diaphragm and the pad covered with a soft gel-like coating resin is proposed. In this pressure sensor, a fluorine-based gel is used as the gel-like coating resin.

SUMMARY

A semiconductor device includes a pad formed on a surface of a substrate, a bonding wire for connecting the pad to an external circuit, and a resin layer covering at least a connection portion between the pad and the bonding wire and exposing at least a part of the substrate outside the pad.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
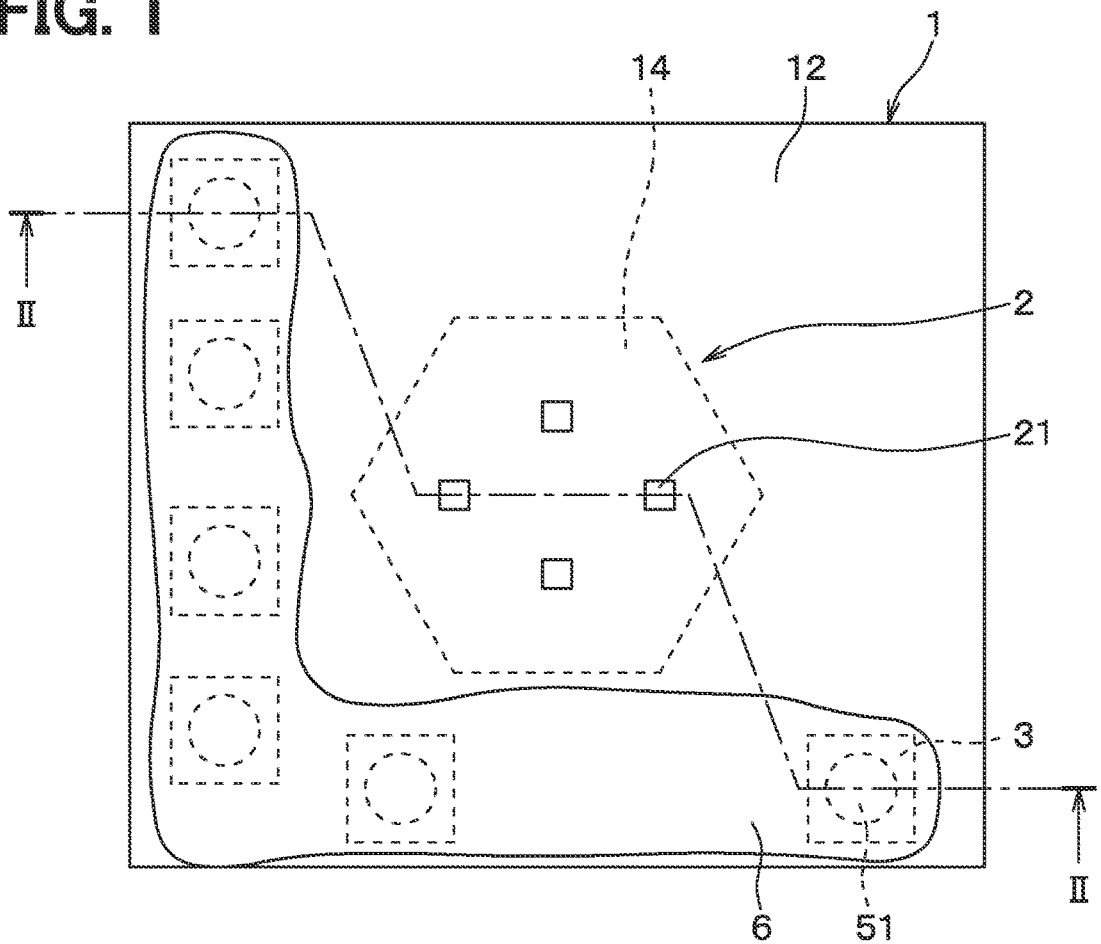
FIG. 1 is a diagram showing a plan view of a physical quantity sensor according to a first embodiment.

A semiconductor device and a method of manufacturing the same are provided, and in particular, a physical quantity sensor is provided to include a sensor element that outputs a signal according to an applied physical quantity, a pad for reading out an output signal from the sensor element, and a bonding wire that connects the pad to an external circuit.

Since the fluorine-based gel has low permeability to liquid chemicals and water, when covering the pressure sensor with the fluorine-based gel, the corrosion of the pad by the liquid is restricted. However, since the gel-like material does not have a sufficiently low permeability to gaseous chemicals or water vapor, there is a possibility that the gas transmitted through the gel may cause corrosion of the pad.

As a method of suppressing gas permeation, it is conceivable to cover the pressure sensor with a resin material having low liquid and gas permeability instead of such gel. However, a resin material having low liquid and gas permeability, in general, has a high elastic modulus, and when a material having a high elastic modulus is applied on the diaphragm, the sensor characteristics may fluctuate.

Also, in physical quantity sensors other than pressure sensors, if the sensors are covered with a resin material having a low liquid and gas permeability to suppress the corrosion of the pads, the sensor characteristics may fluctuate.

In addition, in the case of semiconductor devices other than physical quantity sensors, if the entire substrate is covered with a resin material having a low liquid and gas permeability to suppress corrosion of the pad, the characteristics of the portion other than the pad may fluctuate.

Thus, a semiconductor device is provided for suppressing pad corrosion and fluctuation of sensor characteristics, and a method of manufacturing the same is provided. A semiconductor device is also provided for suppressing the corrosion of the pad and the fluctuation of the characteristics of portions other than the pad, and a method of manufacturing the same is also provided.

According to an example embodiment, in a semiconductor device including a pad formed on the surface of a substrate and a bonding wire connecting the pad to an external circuit, at least a connection portion between the pad and the bonding wire is covered, and the device includes a resin layer that exposes at least a part of a portion of the substrate outside the pad.

According to this, since the connection portion between the pad and the bonding wire which may be susceptible to corrosion is covered with the resin layer, the corrosion of the pad is restricted. In addition, since the resin layer is formed to expose at least a part of the portion of the substrate outside the pad, even when the resin layer is made of a material having a low liquid and gas permeability, that is, the material having a high elastic modulus, it is possible to suppress the fluctuation of the characteristics of the portions other than the pad.

According to an example embodiment, a semiconductor device includes a sensor element formed on a substrate and outputting a signal according to an applied physical quantity, and a pad is for reading out an output signal from the sensor element. A resin layer covers at least the connection portion between the pad and the bonding wire, and exposes at least a part of the sensor element.

According to this, since the connection portion between the pad and the bonding wire which may be susceptible to corrosion is covered with the resin layer, the corrosion of the pad is restricted. In addition, since the resin layer is formed to expose at least a part of the sensor element, even when the resin layer is made of a material having low liquid and gas permeability, that is, a material having a high elastic modulus, fluctuation of the characteristics of the sensor element is suppressed.

Further, according to an example embodiment, a semiconductor device includes a second resin layer formed in an upper portion of the first resin layer disposed over at least the pad when the resin layer is defined as the first resin layer. The amount of permeation of liquid and gas in the first resin layer is smaller than that of the second resin layer.

Thus, the second resin layer is more easily deformed than the first resin layer by forming the second resin layer such that the amount of liquid and gas permeation is larger than that of the first resin layer. Therefore, for example, in both the case where the second resin layer is formed only over the pad, and the case where the second resin layer is formed over the pad and also formed on the portion of the substrate outside the pad, it is possible to suppress the fluctuation of the characteristics of the portions other than the pad, compared with the case where the first resin layer is formed on the entire substrate. For example, in a semiconductor device having a sensor element, both the case where the second resin layer is formed only over the pad and the case where the second resin layer is formed over the pad and also formed on the top of the sensor element, it is possible to suppress the fluctuation of the characteristic of the sensor element, compared with the case where the first resin layer is formed on the entire sensor element.

The liquid and gas permeation amounts of the first resin layer and the second resin layer change with the thickness and the material of each layer. For example, the first resin layer is made of a material having a lower liquid and gas permeability than the material of the second resin layer, and the thickness of each layer is adjusted so that the liquid and gas permeation amount of the first resin layer is smaller than the second resin layer.

Further, the resin layer may be made of an epoxy resin or a polyacrylic resin, and the semiconductor device may be provided with a protection film made of a para-xylylene polymer and formed on the upper surface of the resin layer. In such a configuration, the protection film has lower permeability and higher elastic modulus than the resin layer. When the protection film is formed to be sufficiently thin, the resin layer has a less liquid and gas permeation amount than the protection film.

According to an example embodiment, a semiconductor device includes an insulation film formed on the surface of the pad and having an opening for exposing the upper surface of the pad, and a portion of the pad exposed through the opening has a rounded shape, the portion overlapping with a part of the bonding wire which is spaced apart from the pad.

According to the above feature, since the resin easily flows into the part of the pad which hides behind the bonding wire, it is possible to suppress the pads from being exposed from the resin layer.

Further, according to an example embodiment, the upper surface of the pad has a rounded shape in a portion overlapping with a portion of the bonding wire floating from the pad.

According to the above feature, since the resin easily flows into the part of the pad which hides behind the bonding wire, it is possible to suppress the pads from being exposed from the resin layer.

Further, according to an example embodiment, the semiconductor device includes a liquid repellent film formed on the surface of the substrate, and the resin layer is formed outside the liquid repellent film.

According to the above feature, since the material of the resin layer is repelled by the liquid repellent film, it is possible to easily form the resin layer having a desired shape at low cost.

According to an example embodiment, a method of manufacturing a semiconductor device including a pad formed on a substrate and a bonding wire for connecting the pad to an external circuit includes: forming the pad on the substrate; connecting the bonding wire to the pad; and forming a resin layer by applying the resin over the pad to cover at least a connection portion between the pad and the bonding wire and to expose at least a part of the substrate disposed outside of the pad.

According to the above feature, since the connection portion between the pad and the bonding wire which may be susceptible to corrosion is covered with the resin layer, the corrosion of the pad is restricted. In addition, since the resin layer is formed to expose at least a part of the substrate outside the pad, even when the resin layer is made of a material having a low liquid and gas permeability, that is, the material having a high elastic modulus, it is possible to suppress the fluctuation of the characteristics of the portions other than the pad.

Further, according to an example embodiment, a method of manufacturing a semiconductor device includes: forming a sensor element that outputs a signal according to the applied physical quantity on the substrate. The pad is for reading out an output signal of the sensor element. In the forming of the resin layer, the resin is applied so as to cover at least the connection portion between the pad and the bonding wire and to expose at least a part of the sensor element.

According to the above feature, since the connection portion between the pad and the bonding wire which may be susceptible to corrosion is covered with the resin layer, the corrosion of the pad is restricted. In addition, since the resin layer is formed to expose at least a part of the sensor element, even when the resin layer is made of a material having low liquid and gas permeability, that is, a material having a high elastic modulus, fluctuation of the characteristics of the sensor element is suppressed.

Further, according to an example embodiment, in the forming of the resin layer, the resin is applied to avoid the part of the pad overlapping the part of the bonding wire floating from the pad.

According to the above feature, it is possible to suppress that a resin layer is formed in the part of the bonding wire which is spaced apart from the pad.

Further, according to an example embodiment, a method of manufacturing a semiconductor device includes: forming an insulating film on the surface of the pad; and forming an opening for exposing the upper surface of the pad in the insulating film. In the forming of the opening, the opening is formed so that the upper surface of the pad exposed from the opening has a shape with a corner, and in the forming of the resin layer, the resin is applied to the corner.

According to the above feature, the resin easily gets in the corner, and the pad is suppressed from being exposed from the resin layer.

According to an example embodiment, the opening is formed such that the upper surface of the pad exposed from the opening has a square shape, and the resin layer is formed such that the resin is applied to two, three or four corners of the pad.

According to the above feature, the resin easily gets in the corner, and the pad is suppressed from being exposed from the resin layer.

Further, according to an example embodiment, in the forming of the opening, the opening is formed such that the upper surface of the pad exposed from the opening has a rounded shape at a portion of the upper surface overlapping the bonding wire.

According to the above feature, since the resin easily flows into the part of the pad which hides behind the bonding wire, it is possible to suppress the pads from being exposed from the resin layer.

Hereinafter, embodiments of the present disclosure will be described with reference to the drawings. In the following embodiments, the same or equivalent parts are denoted by the same reference numerals.

First Embodiment

Figure 2:
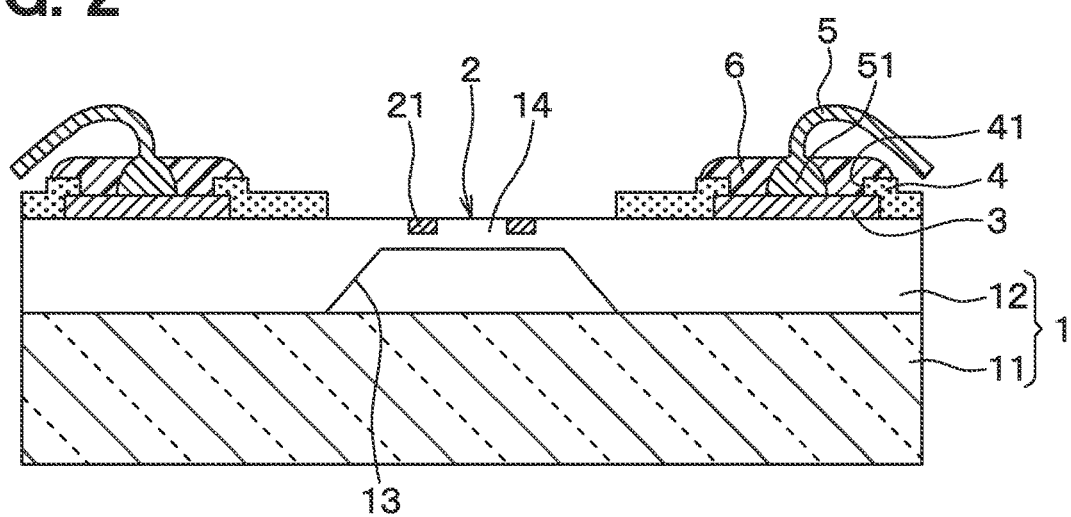
FIG. 2 is a diagram showing a cross-sectional view taken along line II-II of FIG. 1.

A first embodiment will be described. The physical quantity sensor in the present embodiment is a pressure sensor that detects the pressure of the measurement medium, and is used, for example, as an air intake pressure sensor of a car. As shown in FIGS. 1 and 2, the physical quantity sensor in the present embodiment includes a substrate 1, a sensor element 2, a pad 3, an insulation film 4, a bonding wire 5 and a resin layer 6. In FIG. 1, the insulation film 4 is not shown, and only the bonding balls 51 described later are shown for the bonding wires 5.

As shown in FIG. 2, the substrate 1 is configured of a plate-like glass base 11 and a silicon substrate 12 attached to the upper surface of the glass base 11. A hexagonal truncated pyramidal recess 13 is formed in the silicon substrate 12, and the portion of the silicon substrate 12 where the recess 13 is formed is a diaphragm 14 which is thinner than other portions.

The opening of the recess 13 is covered with the glass base 11, and the inside of the recess 13 is vacuum. The substrate 1 is arranged so that the pressure of the measurement medium is applied to the upper surface of the silicon substrate 12 and thereby the diaphragm 14 is deformed.

The sensor element 2 outputs a signal in accordance with the applied physical quantity, and in the present embodiment, outputs a signal in accordance with the pressure of the measurement medium. The sensor element 2 includes a diaphragm 14 and a strain gauge 21 formed on the diaphragm 14. When the diaphragm 14 is deformed by the pressure of the measurement medium, the resistance value of the strain gauge 21 changes.

As shown in FIGS. 1 and 2, the sensor element 2 includes a plurality of strain gauges 21. Specifically, the sensor element 2 includes four strain gauges 21, and four strain gauges 21 and a wiring (not shown) provide a Wheatstone bridge circuit. Each strain gauge 21 is connected to the pad 3 by a wire not shown. In such a configuration, for example, the pressure of the measurement medium can be detected based on the midpoint voltage of the bridge circuit when a constant current is supplied to the above-described bridge circuit.

Each strain gauge 21, a wire for providing the Wheatstone bridge circuit, and a wire for connecting each strain gauge 21 to the pad 3 are formed of a diffusion layer or the like in which a P-type impurity is diffused in the surface layer of the silicon substrate 12.

The pad 3 connects the sensor element 2 and a power supply (not shown), and the pad 3 is for reading out an output signal of the sensor element 2, and is formed on the upper surface of the silicon substrate 12 outside the diaphragm 14. The pad 3 is made of, for example, aluminum or the like.

The insulation film 4 is formed to cover the surface of the pad 3 and the upper surface of the portion of the silicon substrate 12 disposed outside the diaphragm 14, and is made of, for example, silicon nitride. As shown in FIG. 2, an opening 41 for exposing the upper surface of the pad 3 is formed in the insulation film 4, and in the present embodiment, the opening 41 has a square shape.

A bonding wire 5 for connecting the pad 3 to an external circuit is connected to a portion of the upper surface of the pad 3 exposed by the opening 41. The end of the bonding wire 5 on the side of the pad 3 is melted and deformed by heating or the like when connected to the pad 3, whereby the bonding ball 51 is formed as shown in FIG. 2. The bonding wire 5 is connected to the pad 3 at the bonding ball 51. The pad 3 is connected to a power supply not shown or the like via the bonding wire 5 and a circuit board not shown.

In addition, a resin layer 6 is formed on the upper surface of the pad 3. The resin layer 6 suppresses the corrosion of the physical quantity sensor due to liquid or gaseous chemicals or water, particularly the corrosion of the connection portion between the pad 3 and the bonding wire 5, and is made of, for example, epoxy resin or polyacrylic resin.

The resin layer 6 is formed to cover at least a connection portion between the pad 3 and the bonding wire 5 and to expose at least a part of the sensor element 2. In the present embodiment, as shown in FIG. 2, the resin layer 6 is formed so as to cover a connection portion of the pad 3 connected to the bonding ball 51 and a portion of the pad 3 exposed from the bonding ball 51 and the insulation film 4. Further, as shown in FIG. 1, the resin layer 6 is formed only on the outside of the sensor element 2, specifically, only on the outside of the diaphragm 14.

As shown in FIGS. 1 and 2, the physical quantity sensor of the present embodiment includes a plurality of pads 3, and an opening 41 is formed in each pad 3, and a bonding wire 5 is disposed in the sensor. The resin layer 6 is formed in one continuous region including the plurality of pads 3.

In order to manufacture such a physical quantity sensor, first, a P-type impurity is diffused in the surface portion of a silicon substrate 12 in a wafer form to provide a strain gauge 21 and a wiring not shown, and the pad 3 and the insulation film 4 are formed by sputtering. Next, the recess 13 is formed by etching, and the silicon substrate 12 is attached to the glass base 11, and then the silicon substrate 12 is divided into chips by a dicing cut process, and the bonding wire 5 is connected to the pad 3. Then, a resin layer 6 is formed by applying a resin so as to cover at least a connection portion between the pad 3 and the bonding wire 5 and to expose at least a part of the sensor element 2. Specifically, the material of the resin layer 6 is applied to the surfaces of the silicon substrate 12, the pad 3 and the insulation film 4 so as to expose the diaphragm 14 and the strain gauge 21.

The effects of this embodiment will be described. For example, when a physical quantity sensor is used as an air intake pressure sensor arranged in a re-exhaust gas recirculation system of an automobile, the physical quantity sensor is exposed in corrosion environment such as sulfuric acid or nitric acid caused by SOx and NOx contained in exhaust gas, oil or vaporized fuel. Corrosion is likely to occur particularly at the connection portion of the pad 3 with the bonding wire 5.

On the other hand, by forming the resin layer 6 so as to cover at least the connection portion between the pad 3 and the bonding wire 5 as in the present embodiment, corrosion at the connection portion between the pad 3 and the bonding wire 5 is suppressed.

In addition, in the portion of the pad 3 exposed from the insulation film 4 and the bonding ball 51, corrosion is likely to occur. On the other hand, in the present embodiment, since the resin layer 6 covers the portion of the pad 3 exposed from the bonding ball 51 and the insulation film 4, corrosion at the pad 3 is further suppressed.

In addition, by forming the resin layer 6 locally so as to expose at least a part of the sensor element 2 as in the present embodiment, it is possible to suppress the restriction of the deformation of the diaphragm 14. Therefore, it is possible to suppress the decrease of the sensitivity of the physical quantity sensor and the like and to suppress the fluctuation of the sensor characteristics. Further, in the present embodiment, since the resin layer 6 is formed only on the outside of the sensor element 2, it is possible to further suppress the fluctuation of the sensor characteristics.

As described above, in the present embodiment, by forming the resin layer 6 locally, it is possible to suppress the corrosion of the pad and the fluctuation of the sensor characteristics.

Figure 3:
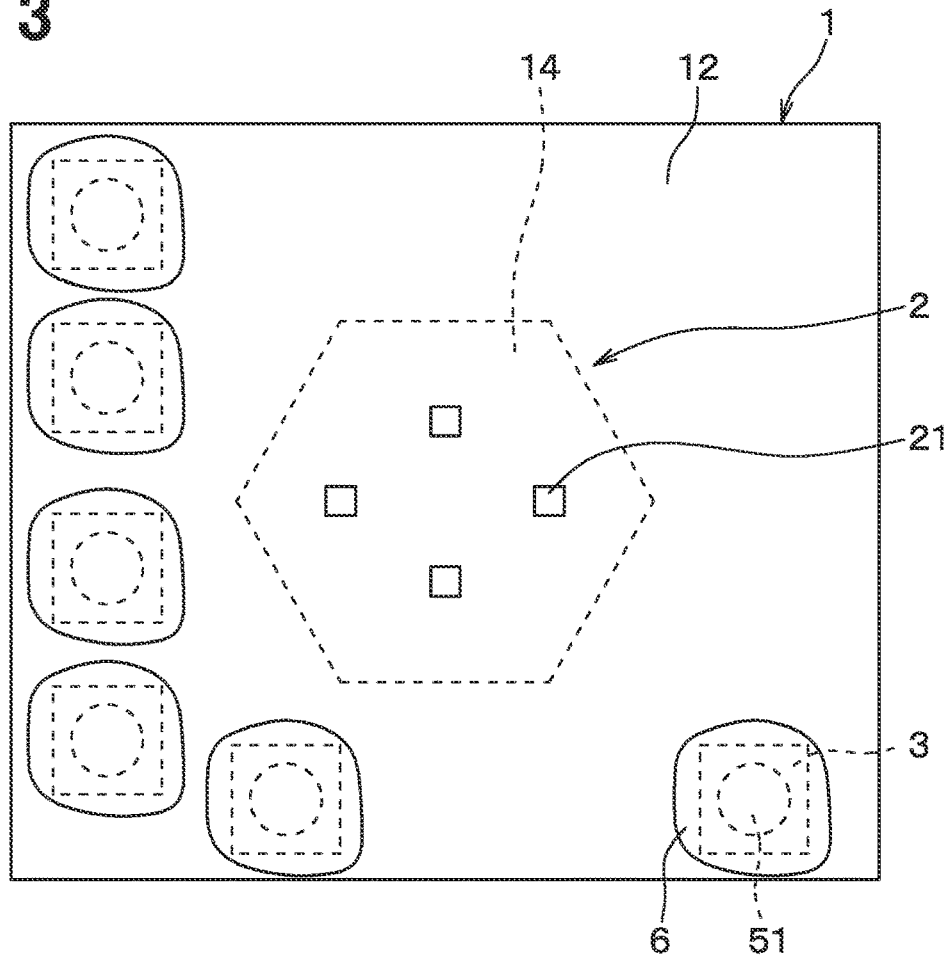
FIG. 3 is a diagram showing a plan view of a modification of the first embodiment.

In the present embodiment, the resin layer 6 is formed in one continuous region including the plurality of pads 3. Alternatively, as shown in FIG. 3, the resin layer 6 may be formed in multiple regions which are spaced apart from each other, and the pad 3 may be covered in each region.

Further, in the case where the bonding wire 5 is connected to only a part of the plurality of pads 3, for example, in the case where multiple pads 3 include the test pad which is not connected to the bonding wire 5, a resin may be applied to the test pad 3 to close the opening 41 after completing the test. As described above, the resin layer 6 is formed to cover the pad 3 separated from the bonding wire 5 in addition to the pad 3 on which the bonding wire 5 is formed, so that the corrosion of the pad 3 separated from the bonding wire 5 is restricted.

Second Embodiment

A second embodiment will be described. The present embodiment is similar to the first embodiment except that a resin layer different from the resin layer 6 is added to the first embodiment, and only the parts different from the first embodiment will be explained.

Figure 4:
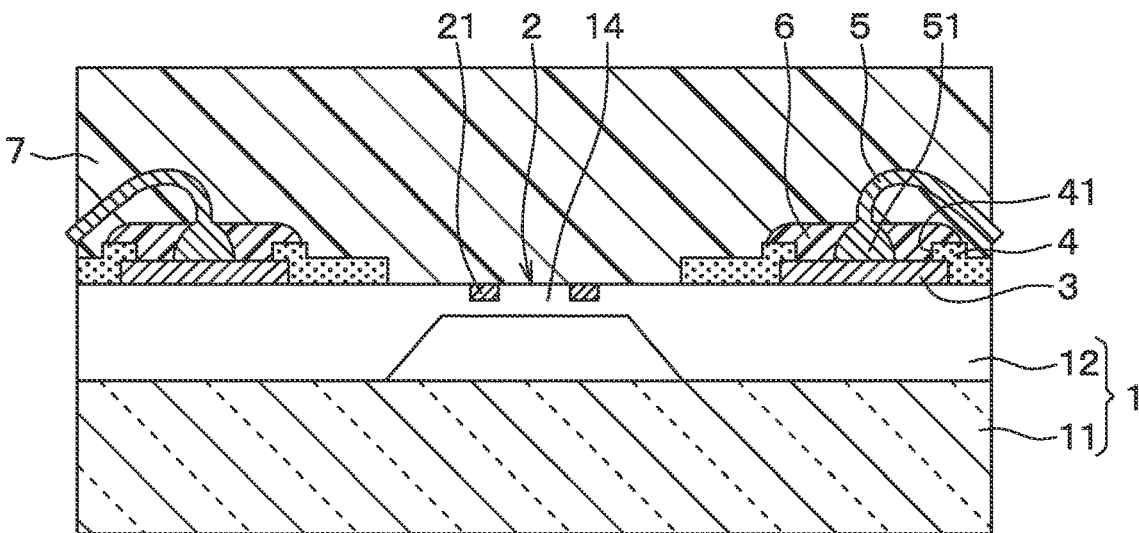
FIG. 4 is a cross-sectional view of a physical quantity sensor according to a second embodiment, which corresponds to FIG. 2.

As shown in FIG. 4, the physical quantity sensor of the present embodiment includes a resin layer 7. Similar to the resin layer 6, the resin layer 7 is formed to suppress the corrosion of the physical quantity sensor, but in order to reduce the influence on the characteristics of the physical quantity sensor, the resin layer 7 is more easily deformed than the resin layer 6.

The amount of deformation of the resin layer 7 when pressure is applied to the physical quantity sensor is adjusted by the thickness of the resin layer 7 and the elastic modulus of the material. In the present embodiment, the resin layer 7 is made of a material having a lower elastic modulus than the material of the resin layer 6, such as silicon gel.

The amount of liquid and gas permeation in the resin layer 6 is smaller than that of the resin layer 7. The permeation amounts of liquid and gas of the resin layer 6 and the resin layer 7 are adjusted by the thickness and material of each layer. In the present embodiment, the resin layer 6 is made of a material having lower permeability to liquid and gas than the material of the resin layer 7. The resin layer 6 and the resin layer 7 correspond to a first resin layer and a second resin layer, respectively.

The resin layer 7 is formed on the upper portion of the resin layer 6 at least on the top of the pad 3. In the present embodiment, the resin layer 7 is formed so as to cover the insulation film 4, the resin layer 6, and the bonding wire 5. The bonding wire 5 is protected by the resin layer 7.

Further, in the present embodiment, the resin layer 7 is also formed on the upper portion of the sensor element 2 in addition to the upper portion of the pad 3, and the sensor element 2, the insulation film 4, the resin layer 6 and the bonding wire 5 are covered by the resin layer 7. In such a configuration, the pressure of the measurement medium is applied to the diaphragm 14 through the resin layer 7.

Further, the resin layer 7 is formed to cover the side surface of the substrate 1 and the circuit board not shown in addition to the upper portion of the substrate 1, and in FIG. 4, only the part of the resin layer 7 arranged on the upper portion of the substrate 1 is illustrated.

By forming the resin layer 7, the corrosion of the pad 3 is further suppressed. Further, since the resin layer 7 is configured to be more easily deformed than the resin layer 6, even when the resin layer 7 is formed, the deformation of the diaphragm 14 is not largely prevented. Therefore, also in this embodiment, the corrosion of the pad 3 and the fluctuation of the sensor characteristics are suppressed.

Third Embodiment

A third embodiment will be described. Since the present embodiment is similar to the second embodiment except that the configuration of the resin layer 7 is changed as compared with the second embodiment, only portions different from the second embodiment will be described.

Figure 5:
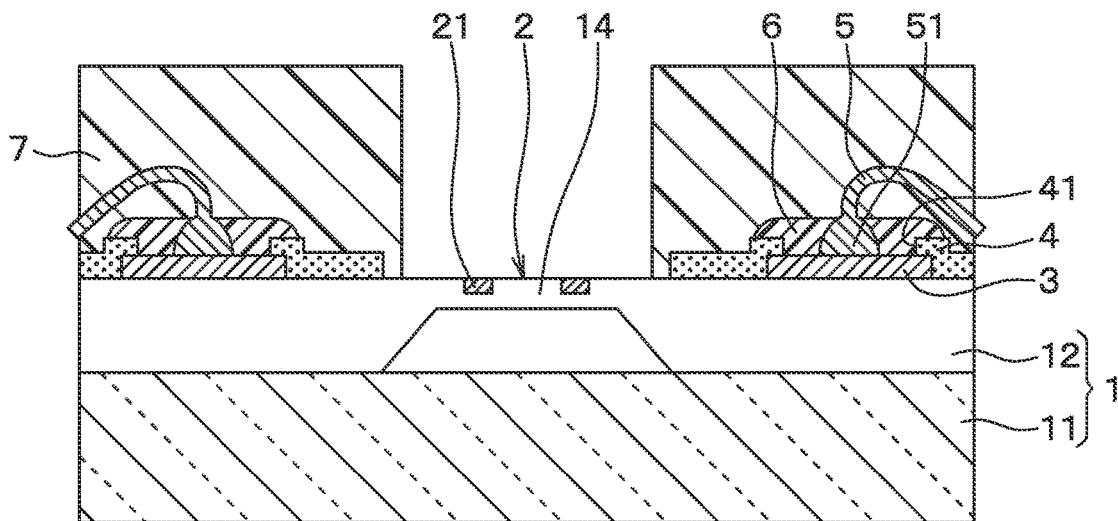
FIG. 5 is a cross-sectional view of a physical quantity sensor according to a third embodiment, which corresponds to FIG. 2.

As shown in FIG. 5, in the present embodiment, the resin layer 7 is formed to expose at least a part of the sensor element 2. Specifically, the resin layer 7 is formed to expose a part of the diaphragm 14.

By forming the resin layer 7 so as to expose at least a part of the sensor element 2, it is further suppressed that the deformation of the diaphragm 14 is prevented. Therefore, in the present embodiment, the fluctuation of the sensor characteristic is further suppressed.

Fourth Embodiment

A fourth embodiment will be described. Since the present embodiment is similar to the second embodiment except that the configuration of the resin layer 7 is changed as compared with the second embodiment, only portions different from the second embodiment will be described.

Figure 6:
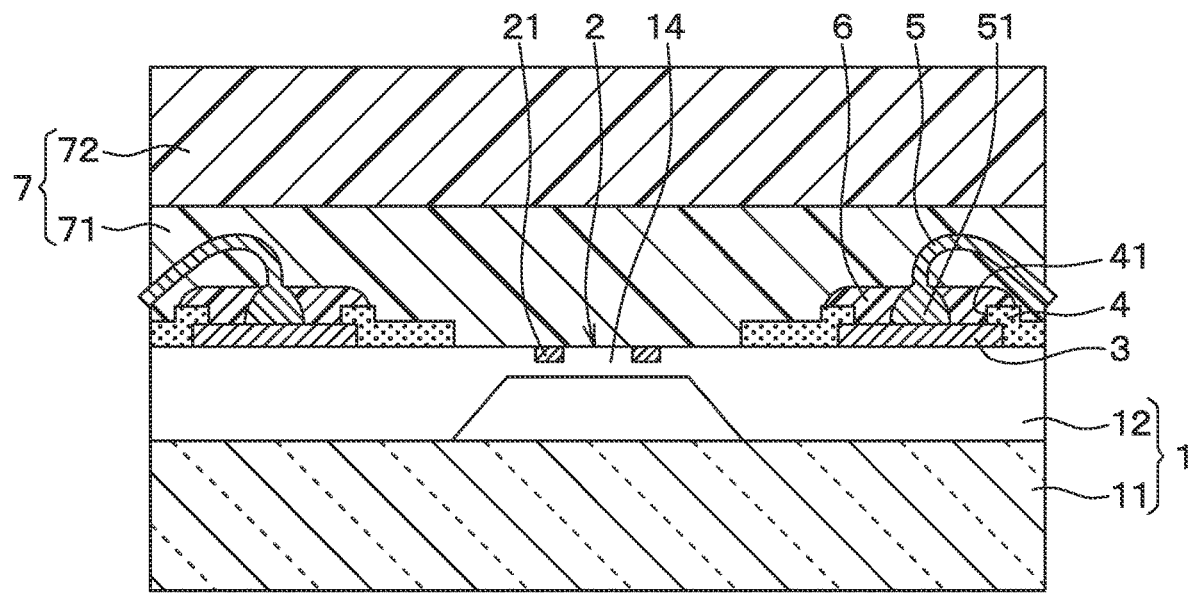
FIG. 6 is a cross-sectional view of a physical quantity sensor according to a fourth embodiment, which corresponds to FIG. 2.

As shown in FIG. 6, in the present embodiment, the resin layer 7 includes a first layer 71 formed on the upper portion of the resin layer 6, and a second layer 72 formed on the upper portion of the first layer. Three layers of a resin layer 6, a first layer 71, and a second layer 72 are stacked on the upper portion of the pad 3.

In such a configuration, when the liquid or gas passes through the second layer 72 and reaches the interface between the first layer 71 and the second layer 72, the liquid or gas spreads at the boundary between the first layer 71 and the second layer 72. Therefore, it is suppressed that the liquid or the gas passes through the first layer 71 and reaches the insulation film 4, the resin layer 6, and the like. Therefore, the liquid and gas are restricted from passing through the resin layer 7, and the corrosion of the pad 3 is further suppressed.

Fifth Embodiment

A fifth embodiment will be described. Since the present embodiment is similar to the second embodiment except that the configuration of the resin layer 6 is changed as compared with the second embodiment, only portions different from the second embodiment will be described.

Figure 7:
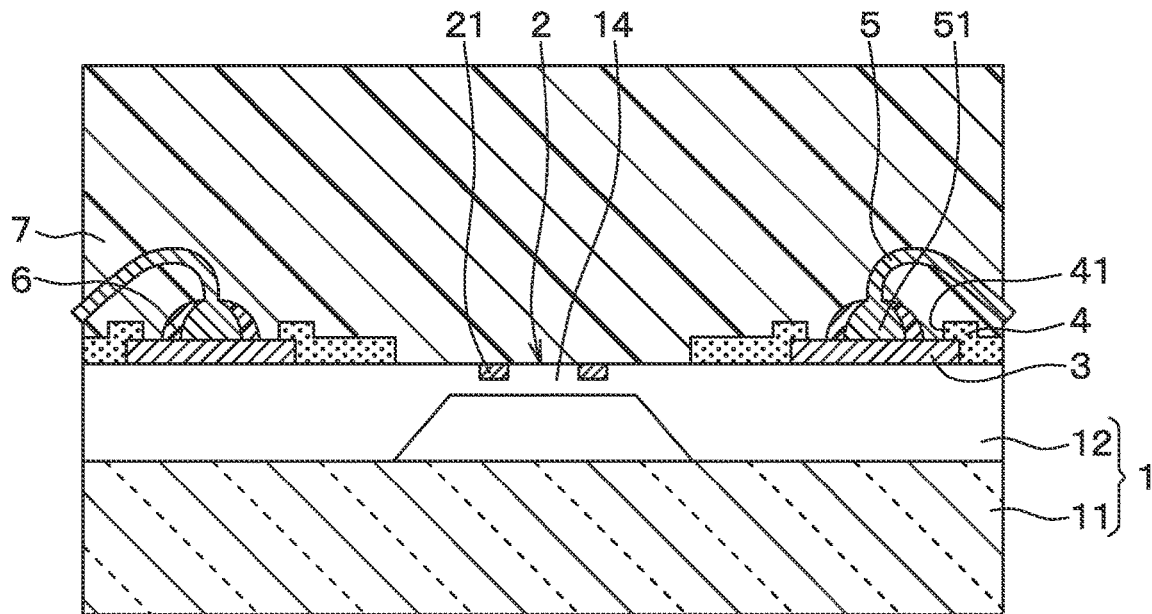
FIG. 7 is a cross-sectional view of a physical quantity sensor according to a fifth embodiment, which corresponds to FIG. 2.

As shown in FIG. 7, in the present embodiment, the resin layer 6 covers only the connection portion of the pad 3 with the bonding ball 51, and the surface of the pad 3 exposed from the insulation film 4, the bonding ball 51 and the resin layer 6 is covered with a resin layer 7.

As described above, even in the configuration in which the resin layer 6 covers only the connection portion of the pad 3 with the bonding wire 5, corrosion of the pad 3 in the connection portion is suppressed.

Sixth Embodiment

A sixth embodiment will be described hereafter. The present embodiment is similar to the second embodiment except that a protection film is added to the second embodiment, and therefore only parts different from the second embodiment will be described.

Figure 8:
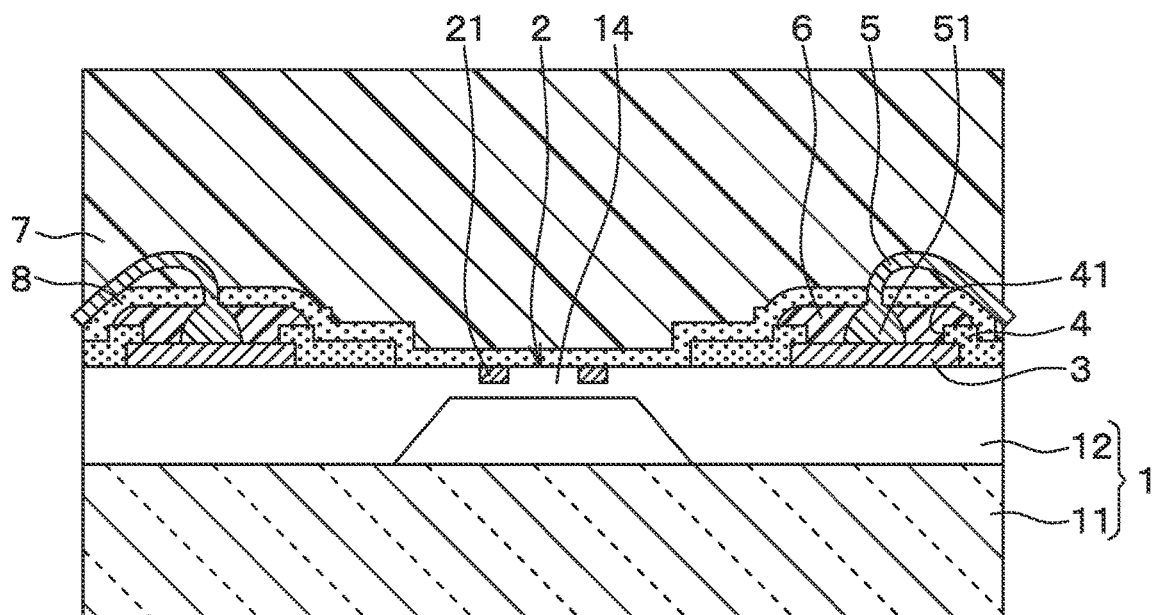
FIG. 8 is a cross-sectional view of a physical quantity sensor according to a sixth embodiment, which corresponds to FIG. 2.

As shown in FIG. 8, in the present embodiment, a protection film 8 made of parylene (registered trademark), which is a paraxylylene polymer, is formed on the upper surface of the resin layer 6. Specifically, the protection film 8 is formed to cover the silicon substrate 12, the insulation film 4, and the resin layer 6, and the resin layer 7 is formed on the upper surface of the protection film 8.

The protection film 8 made of parylene has a lower permeability to liquids and gases than the resin layer 6 and the resin layer 7, and a high elastic modulus. When the protection film 8 is formed to be sufficiently thin, the amount of permeation of liquid and gas in the protection film 8 is larger than that of the resin layer 6, so that the protection film 8 is easily deformed. That is, the resin layer 6 has a configuration in which the amount of permeation of liquid and gas is smaller than that of the protection film 8.

In the present embodiment in which the protection film 8 is formed, when the liquid or gas passes through the resin layer 7 and reaches the interface between the resin layer 7 and the protection film 8, the liquid or gas spreads at the interface between the resin layer 7 and the protection film 8. Therefore, the liquid or gas can be prevented from reaching the insulation film 4, the resin layer 6 or the like, and the corrosion of the pad 3 is further suppressed.

Seventh Embodiment

A seventh embodiment will be described. Since the present embodiment is similar to the first embodiment except that the formation method of the resin layer 6 is changed as compared with the first embodiment, only portions different from the first embodiment will be described.

In order to sufficiently suppress the corrosion of the pad 3, it is preferable to cover the portion of the pad 3 exposed from the insulation film 4 and the bonding ball 51 with the resin layer 6. However, when the material of the resin layer 6 is applied from above the bonding wire 5, the resin layer 6 may not be formed in the portion hidden by the bonding wire 5.

In addition, when the material of the resin layer 6 is applied from above the bonding wire 5, and when it is desired to contact only the bonding ball 51 of the bonding wire 5 with the resin layer 6, the resin layer 6 may contact the portion of the bonding wire 5 other than the bonding ball 51.

On the other hand, it is possible to contact only the bonding ball 51 of the bonding wire 5 with the resin layer 6 while covering the entire pad 3 with the resin layer 6 by increasing the application accuracy. However, the improvement of the accuracy of the application may increase the manufacturing cost.

Figure 9A:
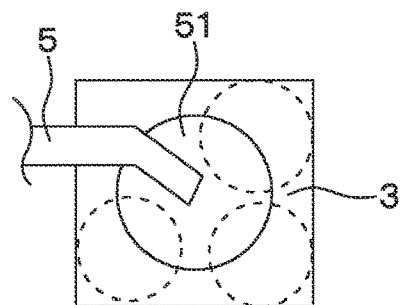
FIG. 9A is a plan view showing a manufacturing process of a physical quantity sensor according to a seventh embodiment.

Therefore, in the present embodiment, the material of the resin layer 6 is applied to a plurality of places separated from the bonding wire 5. Specifically, the insulation film 4 is formed so that the upper surface of the pad 3 exposed from the opening 41 has a shape with a corner. Here, the opening 41 has a rectangular shape similar to the first embodiment. Then, as shown in FIG. 9A, the resin is applied to three corner portions of the pad 3 separated from the bonding wire 5 and selected from four corner portions of the upper surface of the pad 3 exposed from the opening 41 having the rectangular shape.

Figure 9B:
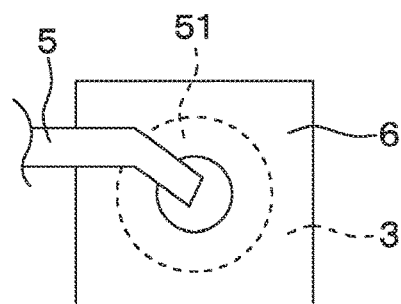
FIG. 9B is a plan view showing the manufacturing process subsequent to FIG. 9A.

Then, as shown in FIG. 9B, the applied resin wraps under the bonding wire 5, the resin layer 6 is also formed in the portion hidden by the bonding wire 5, and the pad 3 is covered with the resin layer 6. When the bonding ball 51 is disposed at the central portion of the pad 3 exposed from the opening 41, the resin is applied to the corner of the pad 3 so that a part of the bonding wire 5 other than the bonding ball 51 is restricted from contacting the resin layer 6.

In the present embodiment, although the resin is applied to the three corner portions of the pad 3, the resin may be applied to two corner portions apart from the bonding wire 5 selected among four corner portions of the pad 3. Further, when the bonding wire 5 does not overlap any corner, resin may be applied to the four corners of the pad 3.

Further, in the present embodiment, the resin is applied to the three corner portions once at a time. Alternatively, after the resin is applied to the three corner portions once and the resin is cured, the resin may be applied again to two corner portions close to a portion hidden by the bonding wire 5 selected among the three corner portions. When the resin is applied in this manner, the resin applied for the second time easily flows under the bonding wire 5 due to the step between the resin applied for the first time and the pad 3, so that the pad 3 is further restricted from being exposed from the resin layer 6.

Eighth Embodiment

An eighth embodiment will be described hereafter. Since the present embodiment is similar to the first embodiment except that the formation method of the resin layer 6 is changed as compared with the first embodiment, only portions different from the first embodiment will be described.

Figure 10:
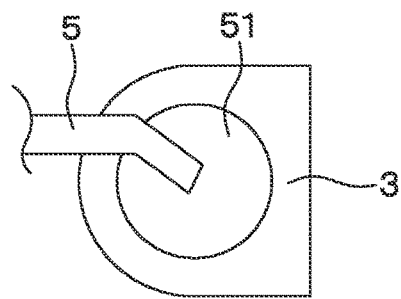
FIG. 10 is a diagram showing a plan view of a physical quantity sensor according to an eighth embodiment.

In the present embodiment, the opening 41 has a rounded shape in a portion overlapping the bonding wire 5. As a result, as shown in FIG. 10, the upper surface of the portion of the pad 3 exposed from the opening 41 has a rounded shape in the portion overlapping the bonding wire 5. Specifically, the upper surface of the pad 3 has a semicircular shape which is convex toward the outside of the substrate 1, and the curved portion of the pad 3 overlaps the portion of the bonding wire 5 which is spaced apart from the pad 3.

In the case where the resin is applied by avoiding the portion of pad 3 overlapping the portion of the bonding wire 5 floating from the pad 3, the dispensing nozzle is disposed on the opposite side to the bonding wire 5 to apply the resin. At this time, when the opening 41 has a shape with a corner portion at the portion overlapping the bonding wire 5, the resin does not flow into the corner portion when the amount of resin to be applied is small, and the pad 3 may be exposed from the resin layer 6.

On the other hand, in the present embodiment, the upper surface of the pad 3 exposed from the opening 41 has a rounded shape in the portion overlapping with the bonding wire 5, so that resin easily flows into a corner of the opening 41. Therefore, the pad 3 is prevented from being exposed from the resin layer 6.

When the radius of curvature of the opening 41 is too small, the resin may not flow into a corner of the opening 41. The radius of curvature of the opening 41 may be determined based on the radius of curvature of the shape of the resin layer formed by surface tension when the resin is dropped. For example, by increasing the curvature radius to be larger than 0.03 mm, the resin easily flows into a corner of the opening 41, and the pad 3 is further suppressed from being exposed from the resin layer 6.

Figure 11:
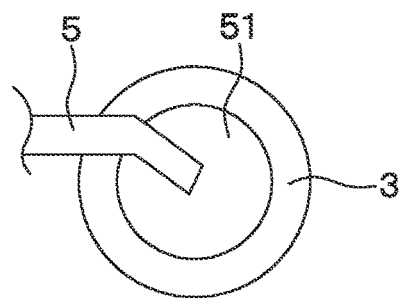
FIG. 11 is a plan view of a first modification of the eighth embodiment.
Figure 12:
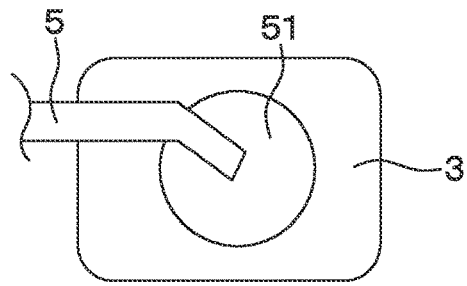
FIG. 12 is a plan view of a second modification of the eighth embodiment.

Although the upper surface of the pad 3 exposed from the opening 41 is semicircular in this embodiment, the upper surface of the pad 3 may have another shape in which the portion overlapping the bonding wire 5 is rounded. For example, as shown in FIG. 11, the upper surface of the pad 3 may be circular, or as shown in FIG. 12, the upper surface of the pad 3 may have a rectangular shape with four rounded corner portions.

Ninth Embodiment

A ninth embodiment will be described hereafter. Since the present embodiment is similar to the first embodiment except that the formation method of the resin layer 6 is changed as compared with the first embodiment, only portions different from the first embodiment will be described.

Figure 13:
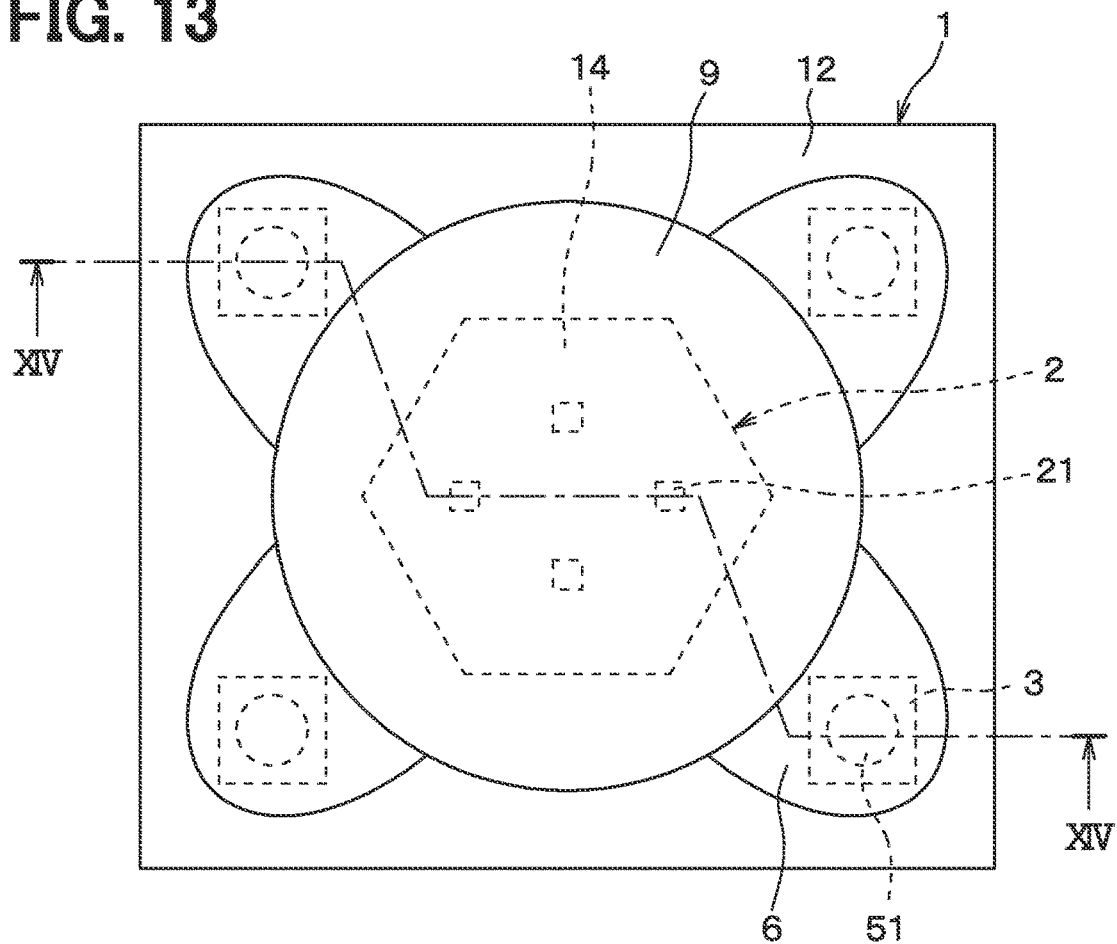
FIG. 13 is a diagram showing a plan view of a physical quantity sensor according to a ninth embodiment.
Figure 14:
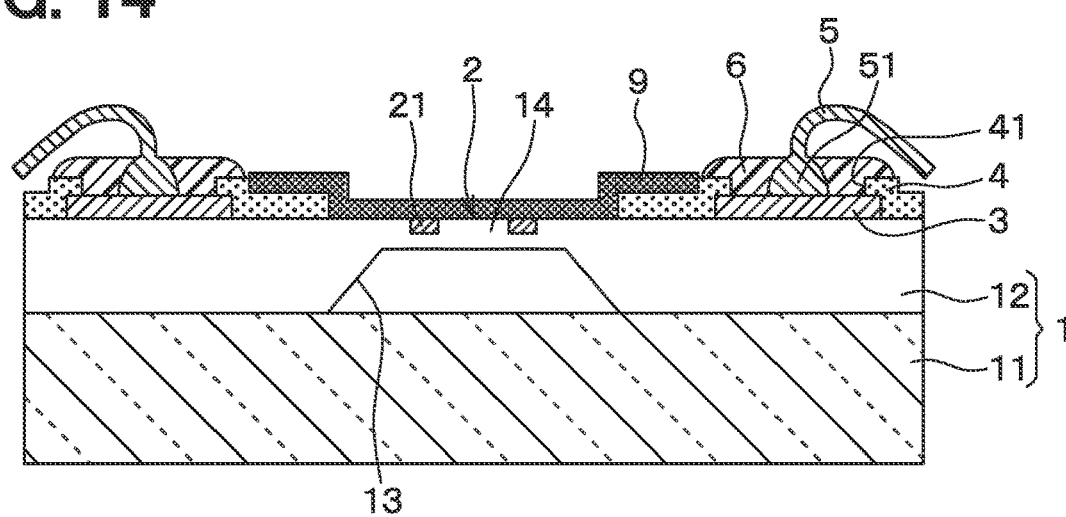
FIG. 14 is a cross-sectional view taken along line XIV-XIV of FIG. 13.

As shown in FIGS. 13 and 14, in the present embodiment, the liquid repellent film 9 is formed on the surface of the silicon substrate 12, and the diaphragm 14 of the sensor element 2 is covered with the liquid repellent film 9. The resin layer 6 is formed outside the liquid repellent film 9. The liquid repellent film 9 is a thin film having liquid repellency, and the wettability of the material of the resin layer 6 is controlled by the liquid repellent film 9.

As the liquid repellent film 9, a silicone-based or fluorine-based coating agent having a contact angle to water of 90 degrees or more may be used. From the viewpoint of environmental resistance, it is preferable to form the liquid repellent film 9 with a fluorine-based coating agent such as FAS (fluoroalkylsilane).

Moreover, in order to suppress the fluctuation of the characteristic of the sensor element 2, it is preferable to provide the liquid repellent film 9 with a material having a low elastic modulus, and to decrease the film thickness to be sufficiently small.

By forming such a liquid repellent film 9 before forming the resin layer 6, the material of the resin layer 6 is repelled by the liquid repellent film 9, so that the material of the resin layer 6 is restricted from applying to the sensor element 2. Therefore, the resin layer 6 having a desired shape is easily formed at low cost.

Figure 15A:
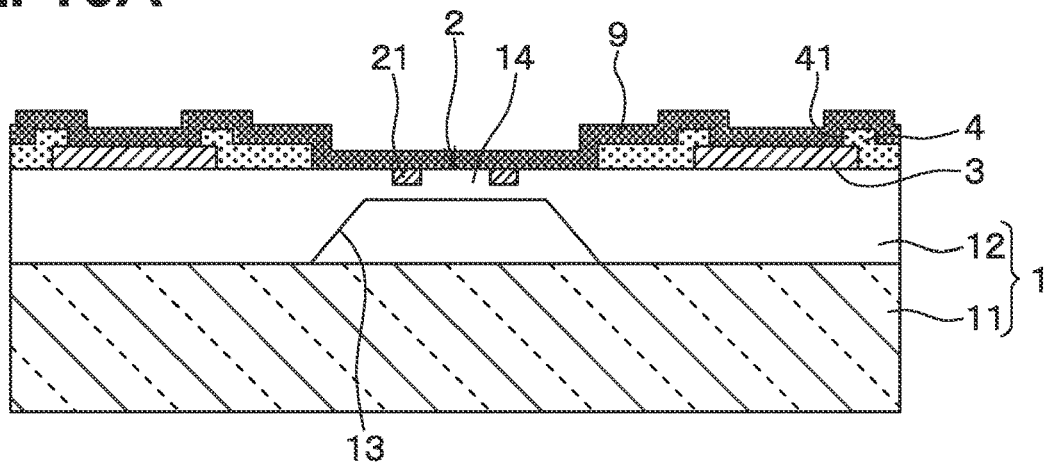
FIG. 15A is a cross-sectional view showing a manufacturing process of a modification of the ninth embodiment.
Figure 15B:
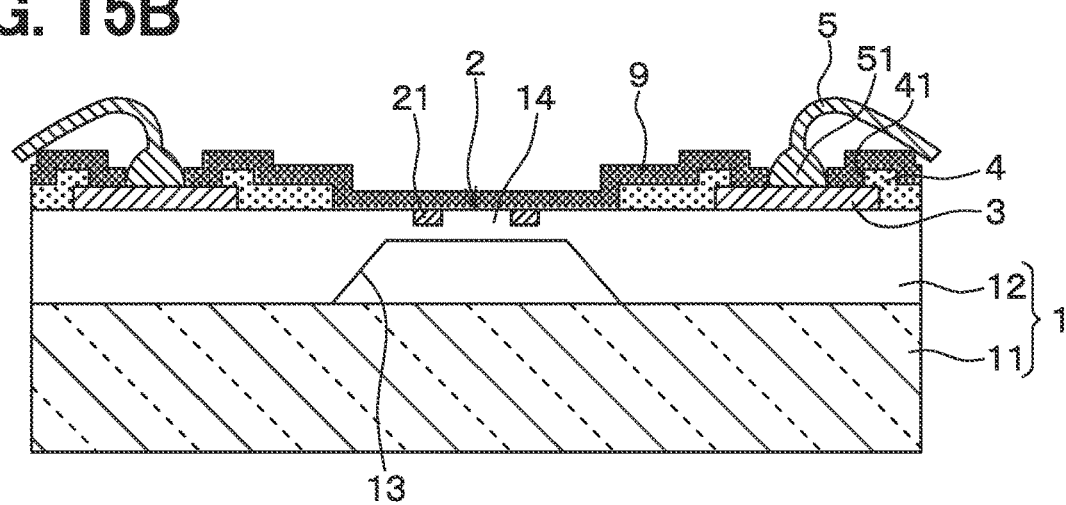
FIG. 15B is a cross-sectional view showing the manufacturing process subsequent to FIG. 15A.
Figure 15C:
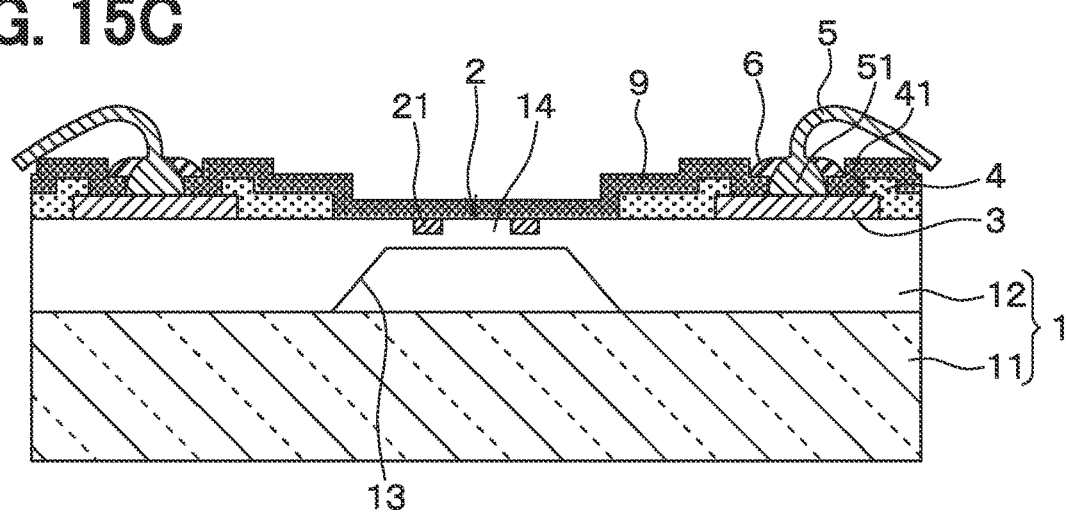
FIG. 15C is a cross-sectional view showing the manufacturing process subsequent to FIG. 15B.

Although the liquid repellent film 9 is formed on the diaphragm 14 in the present embodiment, the liquid repellent film 9 may be formed on the upper surface of the pad 3 in addition to the diaphragm 14 as shown in FIG. 15A. When the liquid repellent film 9 is formed sufficiently thin, as shown in FIG. 15B, the liquid repellent film 9 formed on the upper surface of the pad 3 is torn by pressure or the like at the time of wire bonding, so that the pad 3 is electrically connected to the bonding wire 5. In this case, as shown in FIG. 15C, the resin layer 6 may be formed only on the portion where the liquid repellent film 9 is broken and the pad 3 is exposed.

When the liquid repellent film 9 is formed on the upper surface of the pad 3 as described above, the liquid repellent film 9 is made of material having a low elastic modulus with a sufficiently small film thickness, so that the influence of the liquid repellent film 9 on the wire bonding is reduced.

The liquid repellent film 9 is formed by coating. Alternatively, the liquid repellent layer 9 may be formed by a method other than coating, for example, a vapor deposition method, a dipping method, or the like. By forming the liquid repellent layer 9 by a vapor deposition method, a dipping method or the like, it becomes possible to manufacture the physical quantity sensor more easily at low cost.

Further, the liquid repellent film 9 may be formed before the dicing cut for dividing the silicon substrate 12 into chip units, or may be formed after the dicing cut.

Other Embodiment

The present disclosure is not limited to the above-described embodiments, and can be appropriately modified. The above embodiments are not independent of each other, and can be appropriately combined together except when the combination is obviously impossible. Individual elements or features of a particular embodiment are not necessarily essential unless it is specifically stated that the elements or the features are essential in the foregoing description, or unless the elements or the features are obviously essential in principle. Further, in each of the embodiments described above, when numerical values such as the number, numerical value, quantity, range, and the like of the constituent elements of the embodiment are referred to, except in the case where the numerical values are expressly indispensable in particular, the case where the numerical values are obviously limited to a specific number in principle, and the like, the present disclosure is not limited to the specific number. Further, in each of the embodiments described above, when referring to the shape, positional relationship, and the like of the components and the like, it is not limited to the shape, positional relationship, and the like, except for the case where the components are specifically specified, the case where the components are fundamentally limited to a specific shape, positional relationship, and the like.

For example, in order to suppress fluctuation of sensor characteristics, it is preferable to form the resin layer 6 only on the outside of the sensor element 2 as in the first embodiment. Alternatively, at least a part of the sensor element 2 may be exposed from the resin layer 6, and a part of the resin layer 6 may be formed on the upper portion of the sensor element 2.

Further, in the configuration in which the resin layer 6 covers the surface of pad 3 exposed from the insulation film 4 and the bonding ball 51, the resin layer 6 may not be formed on the upper surface of insulation film 4, and may be formed only inside of the opening 41.

Further, the liquid and gas permeation amount of the resin layer 6, the resin layer 7, and the protection film 8 may be adjusted by the film thickness, or may be adjusted by both the film thickness and the material. Similarly, the deformation amount of the resin layer 6, the resin layer 7, and the protection film 8 may be adjusted by the film thickness, or may be adjusted by both the film thickness and the material.

Alternatively, the resin layer 7 may not be formed on the surfaces of the pad 3, the insulation film 4, and the silicon substrate 12, but may be formed only on the surfaces of the bonding wire 5 and the resin layer 6.

In the fifth and sixth embodiments, the physical quantity sensor may not be provided with the resin layer 7. In the fourth to sixth embodiments, the resin layer 7 may be formed to expose at least a part of the sensor element 2 as in the third embodiment. In the fifth and sixth embodiments, the resin layer 7 may include the first layer 71 and the second layer 72.

Further, in the sixth embodiment, the resin layer 6 may be formed so as to cover only the connection portion of the pad 3 with the bonding ball 51, and the protection film 8 may cover the pad 3 in addition to the silicon substrate 12, the insulation film 4 and the resin layer 6.

In the eighth embodiment, the upper surface of the portion of the pad 3 exposed from the opening 41 which overlaps with the bonding wire 5 has a rounded shape according to the shape of the opening 41. Alternatively, the pad 3 may be formed such that the upper surface of the portion of the pad 3 overlapping the bonding wire 5 has a rounded shape, and the opening 41 may be formed so that the rounded portion of the pad 3 is exposed.

In the eighth and ninth embodiments, a resin may be applied as in the seventh embodiment. In the seventh and eighth embodiments, the liquid repellent film 9 may be used as in the ninth embodiment. Further, the resin layer 6 may be formed so as to cover a portion of the bonding wire 5 floating from the pad 3 in addition to the connection portion of the pad 3 with the bonding wire 5.

Alternatively, the present disclosure may be applied to physical quantity sensors other than pressure sensors. Alternatively, the present disclosure may be applied to semiconductor devices other than physical quantity sensors, and the resin layer 6 may be formed to cover at least the connection portion between the pad 3 and the bonding wire 5 and to expose at least a part of the silicon substrate 12 outside the pad 3. Alternatively, in the semiconductor device other than the physical quantity sensor, the resin layer 7 may be formed on the portion of the silicon substrate 12 exposed from the resin layer 6.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A semiconductor device comprising:
    a pad arranged on a surface of a substrate, the substrate including a plate-like glass base and a silicon substrate attached to an upper surface of the plate-like glass base;
    a bonding wire connecting the pad to an external circuit;
    a resin layer covering at least a connection portion between the pad and the bonding wire and exposing at least a part of the substrate outside the pad;
    a protection film made of a paraxylylene polymer and arranged on an upper surface of the resin layer, wherein:
    the resin layer has a smaller amount of liquid and gas permeation than the protection film.

2. The semiconductor device according to claim 1, further comprising:
    an insulation film arranged on a surface of the pad and having an opening for exposing the upper surface of the pad, wherein:
    a part of the pad exposed from the opening has a rounded shape, the part of the pad overlapping with a part of the bonding wire floating from the pad.

3. The semiconductor device according to claim 1, wherein:
    the upper surface of the pad has a rounded shape at a portion of the upper surface overlapping with a part of the bonding wire floating from the pad.

4. The semiconductor device according to claim 1, further comprising:
    a liquid repellent film arranged on a surface of the substrate, wherein:
    the resin layer is arranged outside the liquid repellent film.

5. The semiconductor device according to claim 1, wherein
    the protection film is more easily deformable than the resin layer.

* * * * *